United States Patent
Ku et al.

(10) Patent No.: US 6,784,075 B2
(45) Date of Patent: Aug. 31, 2004

(54) METHOD OF FORMING SHALLOW TRENCH ISOLATION WITH SILICON OXYNITRIDE BARRIER FILM

(75) Inventors: Tzu-Kun Ku, Taipei (TW); Chian-Kai Huang, Kaohsiung (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 10 days.

(21) Appl. No.: 10/237,608

(22) Filed: Sep. 10, 2002

(65) Prior Publication Data

US 2004/0048442 A1 Mar. 11, 2004

(51) Int. Cl.⁷ .............................................. H01L 21/76
(52) U.S. Cl. ...................................... 438/424; 438/435
(58) Field of Search ................................ 438/424, 435, 438/775, 776, 777, 778, 788

(56) References Cited

U.S. PATENT DOCUMENTS

| | | | |
|---|---|---|---|
| 5,763,315 A | * 6/1998 | Benedict et al. | 438/424 |
| 5,780,346 A | 7/1998 | Arghavani et al. | |
| 6,153,480 A | * 11/2000 | Arghavani et al. | 438/296 |
| 6,165,854 A | * 12/2000 | Wu | 438/296 |
| 6,261,925 B1 | 7/2001 | Arghavani et al. | |
| 6,323,106 B1 | * 11/2001 | Huang et al. | 438/433 |
| 6,333,232 B1 | * 12/2001 | Kunikiyo | 438/296 |
| 6,350,662 B1 | 2/2002 | Thei et al. | |
| 6,403,428 B1 | * 6/2002 | Jeng | 438/294 |
| 2002/0068415 A1 | * 6/2002 | Tseng et al. | 438/435 |
| 2002/0177270 A1 | * 11/2002 | Beyer et al. | 438/221 |
| 2002/0197886 A1 | * 12/2002 | Niimi et al. | 438/783 |
| 2003/0015736 A1 | * 1/2003 | Beyer et al. | 257/221 |
| 2003/0203515 A1 | * 10/2003 | Lin et al. | 438/8 |

* cited by examiner

*Primary Examiner*—Vu A. Le
*Assistant Examiner*—Beth E. Owens
(74) *Attorney, Agent, or Firm*—Birch, Stewart, Kolasch & Birch, LLP

(57) ABSTRACT

A method of forming shallow trench isolation in a semiconductor substrate. A hard mask having an opening is formed on the semiconductor substrate. The semiconductor substrate is etched through the opening to form a shallow trench. The semiconductor substrate such as silicon substrate is annealed in an ambient containing nitric oxide or nitrogen and oxygen to form a silicon oxynitride film on the shallow trench to serve as a barrier to prevent dopant source/drain outdiffusion. An insulator is then formed on the hard mask to fill the shallow trench. The insulator is planarized while the hard mask is used as the polishing stop layer. Thereafter, the hard mask is removed to expose the upper surface of the semiconductor substrate and leave a shallow trench isolation.

10 Claims, 3 Drawing Sheets

METHOD OF FORMING SHALLOW TRENCH ISOLATION WITH SILICON OXYNITRIDE BARRIER FILM

BACKGROUND OF THE INVENTION

1. Field of the Invention

The present invention relates to the manufacture of semiconductor devices, and more particularly to a method of forming shallow trench isolations in a semiconductor substrate to reduce stresses caused by etching shallow trenches.

2. Description of the Related Art

In the integrated circuit (IC) industry, shallow trench isolation (STI) is replacing conventional local oxidation of silicon (LOCOS) in order to form improved field isolation structures. The basic STI technology involves etching of the semiconductor substrate to form trenches and then refilling the trenches with an insulating material to produce an isolation region followed by planarization of the insulating material by chemical mechanical polishing (CMP). The steps mentioned above may cause mechanical or thermal stresses in the active semiconductor substrate. These stresses are believed to cause dislocations or defect sites in the active substrate. Accordingly, it has been found that a high leakage current path exists along the source and drain regions of a transistor device formed during subsequent steps in the semiconductor substrate, thereby rendering a lower yield.

U.S. Pat. No. 6,350,662 to Thei et al. discloses a method to reduce defects in shallow trench isolation using nitrogen annealing for 30 to 150 minutes. Defects, dislocations, interface traps, and stresses in the semiconductor substrate can be reduced or eliminated.

U.S. Pat. Nos. 5,780,346 and 6,261,925 to Arghavani at al. disclose a method of forming an isolation structure in a semiconductor substrate. A trench is first etched into a semiconductor substrate. A first oxide layer is then formed in the trench. The first oxide layer is subjected to a nitrogen-oxide gas ambient and is annealed to form an oxy-nitride interface between the first oxide and the semiconductor substrate. However, the silicon oxynitride is formed by nitridation of the silicon oxide layer at an elevated temperature. Process complexity and manufacturing cost may be increased.

Therefore, a need has arisen for a method of forming shallow trench isolation in a semiconductor substrate that can eliminate or reduce stresses caused by bombardment during reactive ion etching for the shallow trench.

SUMMARY OF THE INVENTION

In view of the above disadvantages, an object of the invention is to provide a method of forming shallow trench isolations in a semiconductor substrate. This method is capable of reducing or eliminating the main stresses.

A further object of the invention is to reduce the process complexity and manufacturing cost.

In accordance with one aspect of the invention, there is provided a method of forming shallow trench isolation in a semiconductor substrate. A hard mask having an opening is formed on the semiconductor substrate. The semiconductor substrate is etched through the opening to form a shallow trench. The semiconductor substrate, such as silicon substrate, is annealed in an ambient containing nitric oxide or nitrogen and oxygen to form a silicon oxynitride film on the shallow trench to serve as a barrier to prevent dopants from source/drain outdiffusion. Oxidation and nitridation occur on the exposed silicon substrate in the annealing step. An insulator is then formed on the hard mask to fill the shallow trench. The insulator is planarized while the hard mask is used as the polishing stop layer. Thereafter, the hard mask is removed to expose the upper surface of the semiconductor substrate and leave a shallow trench isolation.

The semiconductor substrate is preferably annealed after the semiconductor substrate is pre-cleaned by a standard clean solution such as a diluted $NH_4OH/H_2O_2$ solution (known as "SC1") or diluted $NH_4OH/HCl$ solution (SC2) followed by cleaning the semiconductor substrate with deionized water.

Furthermore, the semiconductor substrate is preferably annealed at 800 to 1100° C. in an ambient containing nitric oxide or nitrogen and oxygen gas for 2 to 15 minutes.

In accordance with another aspect of the invention, the hard mask preferably comprises a thermal pad oxide formed on the upper surface of the semiconductor substrate and a pad nitride deposited on the pad oxide.

In accordance with a further aspect of the invention, the shallow trench is preferably performed by anisotropic etching using a reactive gas containing HBr, Cl, and $CF_4$.

In accordance with yet another aspect of the invention, the insulator is preferably silicon oxide deposited by high-density plasma chemical vapor deposition (HDPCVD).

In accordance with a still further aspect of the invention, the insulator is planarized by chemical mechanical polishing or etching back until the upper surfaces of the semiconductor substrate and the hard mask are approximately coplanar.

BRIEF DESCRIPTION OF THE DRAWINGS

The preferred embodiment of the invention is hereinafter described with reference to the accompanying drawings in which.

DETAILED DESCRIPTION OF THE INVENTION

Figure 1:
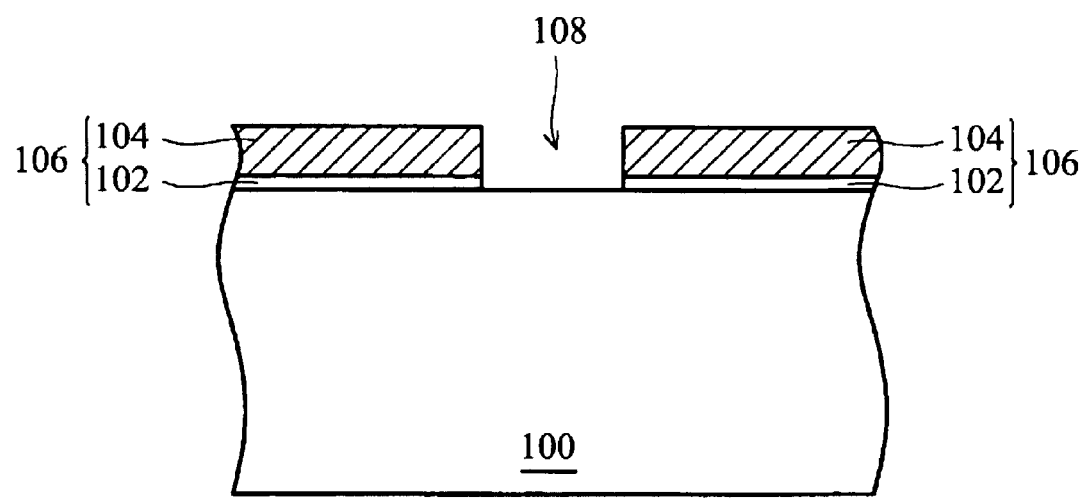
FIGS. 1 to 6 are cross-sections showing the manufacturing steps of forming shallow trench isolation in a semiconductor substrate in accordance with the embodiment of the invention.

As shown in FIG. 1, a semiconductor substrate 100 consisting of single crystalline silicon is provided. A pad oxide 102, having a thickness of about 200 to 400 angstroms, is grown on the semiconductor substrate 100 in an ambient containing oxygen at a temperature of about 800 to 1000° C. This pad oxide 102 is used to increase bonding strength of the subsequently formed pad nitride to the semiconductor substrate 100. Next, a pad nitride 104, having a thickness of about 1000 to 2000 angstroms, is deposited on the pad oxide 102 by low-pressure chemical vapor deposition (LPCVD) using a mixture of gaseous $Si_2Cl_2$ and $NH_3$ at about 0.1 Torr to 1.0 Torr as the deposition source at a temperature of from 700° C. to 800° C.

Thereafter, a photoresist pattern (not shown) is formed by conventional photolithography. The pad nitride 104 and the pad oxide 102 are anisotropically etched by reactive ion etching (RIE) to expose the upper surface of the semiconductor substrate 100 and form a hard mask 106 having an opening 108. The hard mask 106 consists of the remaining pad oxide 102 and the pad nitride 104. The photoresist pattern is then stripped.

Figure 2:
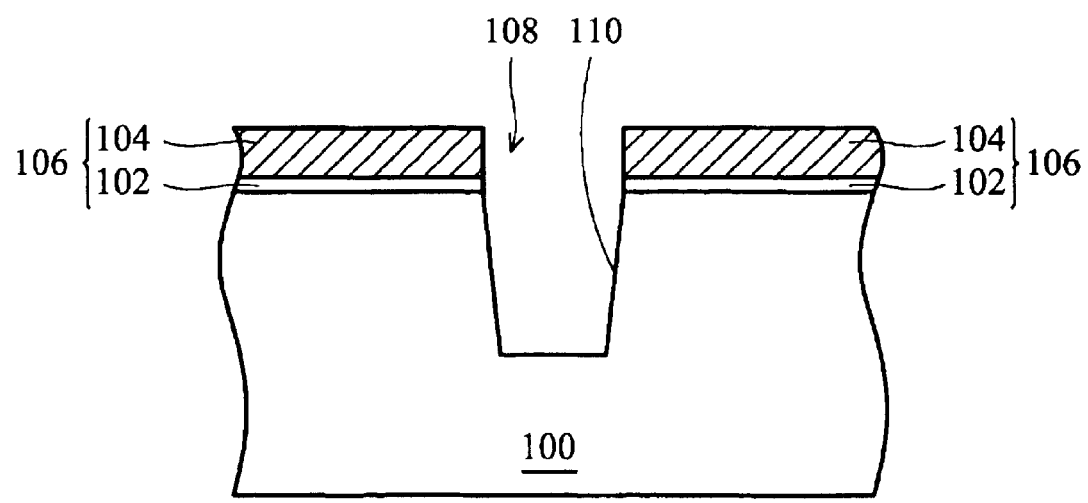

Referring now to FIG. 2, the semiconductor substrate 100 is etched by an etching tool using a reactive gas comprising HBr, Cl, or $CF_4$ through the opening 108 of the hard mask 106. In this etching step, a shallow trench 110 having a depth of about 3000 to 5000 angstroms is created. Mechanical stress is produced in the semiconductor substrate 100 near the sidewall of the shallow trench 110. Next, the semiconductor substrate 100 is cleaned by standard clean solutions such as a diluted $NH_4OH/H_2O_2$ solution (known as "SC1") or a diluted $NH_4OH/HCl$ solution (SC2) combined with deionized water.

Figure 3:
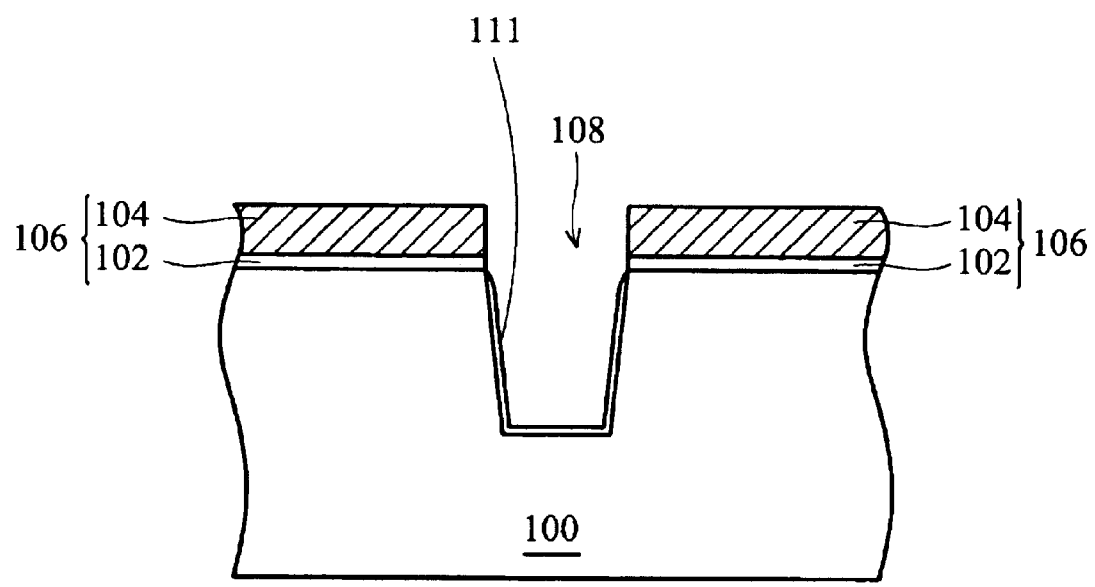

Next, as shown in FIG. 3, the semiconductor substrate 100 is annealed at a temperature of about 800 to 1100° C. in an ambient containing nitric oxide (NO) to conformally form a silicon oxynitride film 111 on the shallow trench 110. The silicon oxynitride film 111 has a thickness of about 20 to 30 angstroms. This annealing process is performed to reduce or remove stresses in the semiconductor substrate 100 caused by etching for the shallow trench 110.

Figure 4:
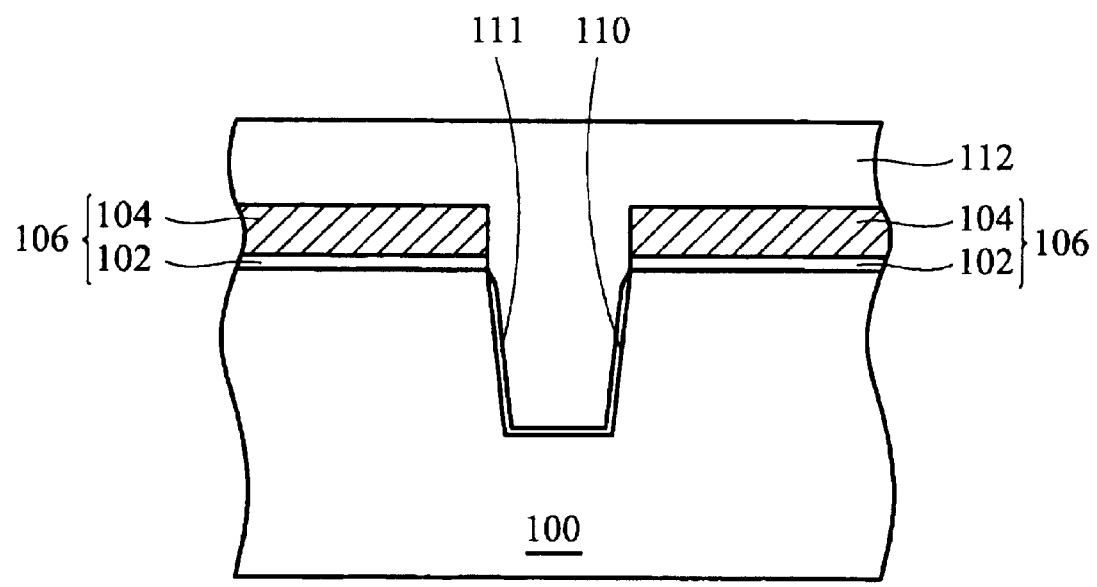

As shown in FIG. 4, an insulator 112 such as silicon oxide is deposited in the shallow trench 110 by high-density plasma chemical vapor deposition (HDPCVD) using tetra-ethyl-ortho-silicate (TEOS) and ozone. Alternately, a reactive gas containing silane and oxygen can be used to replace TEOS and ozone.

Figure 5:
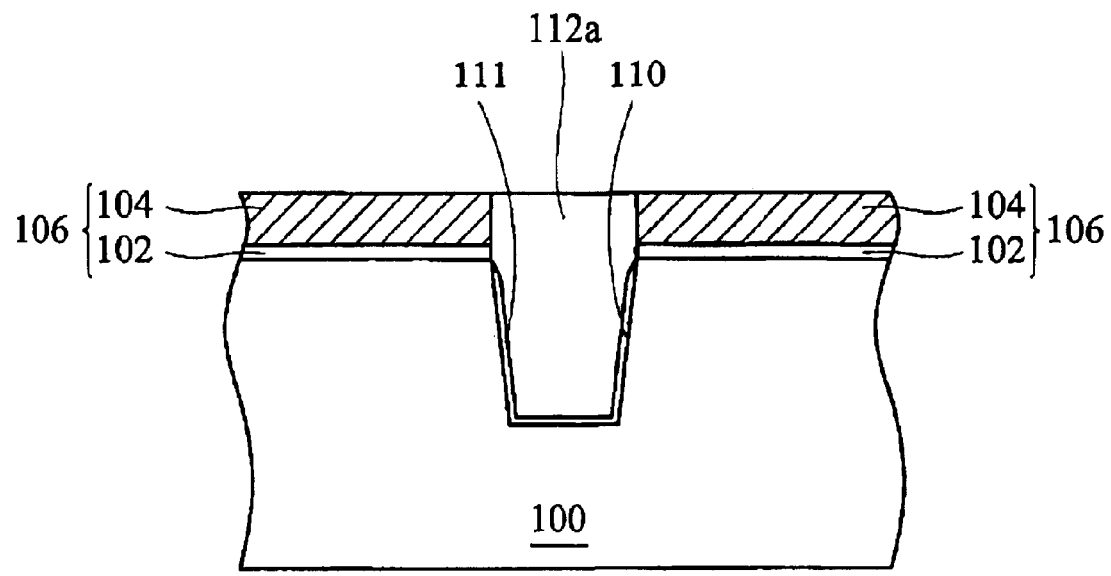

Referring now to FIG. 5 the insulator 112 is planarized by chemical mechanical polishing (CMP) while the hard mask 106 is used as the polishing stop layer so as to leave an insulator 112a whose upper surface is approximately coplanar with the hard mask 106.

Figure 6:
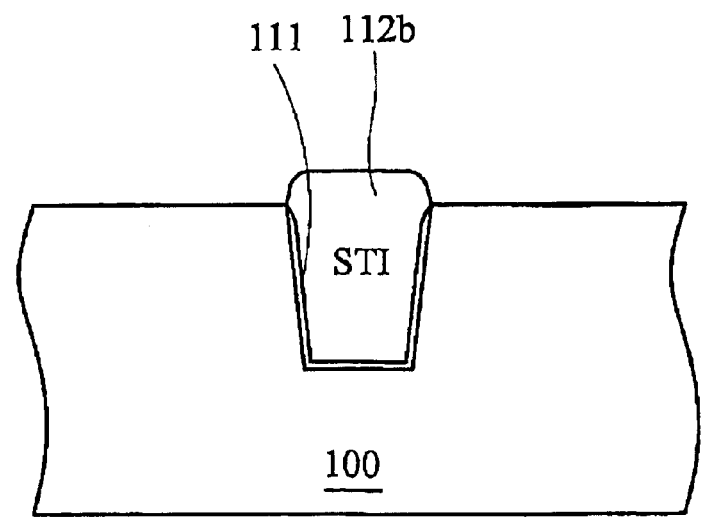

As shown in FIG. 6, a hot phosphoric acid solution is used to remove the pad nitride 104 followed by removal of the pad oxide 102 using a hydrofluoric acid solution until the upper surface of the semiconductor substrate 100 is exposed. In this wet etch process, the insulator 112a is damaged to leave an insulator 112b.

According to the method of forming shallow trench isolation in a semiconductor substrate of the invention, stresses in the semiconductor substrate near shallow trench isolation can be reduced or eliminated, thus improving semiconductor device performance. In addition, the silicon oxynitride film 111 acts as a barrier and prevents dopant outfiffusion from the subsequently formed source/drain of the active region to the insulator formed in the shallow trench 110.

Furthermore, unlike conventional method, the first oxide layer is not necessary; thus reducing the process complexity and manufacturing cost.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method of forming shallow trench isolation in a semiconductor substrate, comprising the steps in sequence of:

forming a hard mask having an opening on the semiconductor substrate;

etching the semiconductor substrate through the opening to form a shallow trench;

conformally forming a silicon oxynitride film on the shallow trench in an ambient containing nitrogen gas ($N_2$) and oxygen gas ($O_2$);

forming an insulator on the hard mask to fill the shallow trench;

planarizing the insulator while the hard mask is used as a polishing stop layer; and removing the hard mask to expose the upper surface of the semiconductor substrate and leave a shallow trench isolation.

2. A method of forming shallow trench isolation in a semiconductor substrate as claimed in claim 1, wherein the semiconductor substrate is a silicon substrate.

3. A method of forming shallow trench isolation in a semiconductor substrate as claimed in claim 2, wherein the hard mask comprises a pad oxide formed on the semiconductor substrate and a pad nitride formed on the pad oxide.

4. A method of forming shallow trench isolation in a semiconductor substrate as claimed in claim 2, wherein formation of the shallow trench is performed by anisotropic etching using a reactive gas containing HBr, Cl, and $CF_4$.

5. A method of forming shallow trench isolation in a semiconductor substrate as claimed in claim 1, wherein formation of the insulator comprises a step of depositing a silicon oxide layer in the shallow trench by high-density plasma chemical vapor deposition (HDPCVD).

6. A method of forming shallow trench isolation in a semiconductor substrate as claimed in claim 1, wherein the insulator is planarized by chemical-mechanical polishing.

7. A method of forming shallow trench isolation in a semiconductor substrate as claimed in claim 1, wherein the hard mask is removed by a phosphoric acid solution.

8. A method of forming shallow trench isolation in a semiconductor substrate as claimed in claim 2, wherein the silicon oxynitride film is formed at a temperature of about 800 to 1100° C.

9. A method of forming shallow trench isolation in a semiconductor substrate as claimed in claim 8, wherein the silicon oxynitride film is formed for 2 to 15 minutes.

10. A method of forming shallow trench isolation in a semiconductor substrate as claimed in claim 1, wherein the silicon oxynitride film has a thickness of about 20 to 30 angstroms.

* * * * *